United States Patent
Moll et al.

(10) Patent No.: US 9,425,189 B1
(45) Date of Patent: Aug. 23, 2016

(54) COMPACT FDSOI DEVICE WITH BULEX CONTACT EXTENDING THROUGH BURIED INSULATING LAYER ADJACENT GATE STRUCTURE FOR BACK-BIAS

(71) Applicant: GLOBALFOUNDRIES Inc., Grand Cayman (KY)

(72) Inventors: Hans-Peter Moll, Dresden (DE); Peter Baars, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/813,292

(22) Filed: Jul. 30, 2015

(51) Int. Cl.
| | |
|---|---|
| *H01L 27/01* | (2006.01) |
| *H01L 31/0392* | (2006.01) |
| *H01L 27/02* | (2006.01) |
| *H01L 29/786* | (2006.01) |
| *H01L 29/06* | (2006.01) |
| *H01L 29/45* | (2006.01) |
| *H01L 29/423* | (2006.01) |
| *H01L 21/02* | (2006.01) |
| *H01L 29/417* | (2006.01) |
| *H01L 21/285* | (2006.01) |
| *H01L 21/308* | (2006.01) |
| *H01L 29/66* | (2006.01) |
| *H01L 27/12* | (2006.01) |
| *H01L 21/8234* | (2006.01) |

(52) U.S. Cl.
CPC ..... *H01L 27/0292* (2013.01); *H01L 21/02636* (2013.01); *H01L 21/28518* (2013.01); *H01L 21/3083* (2013.01); *H01L 21/823418* (2013.01); *H01L 21/823481* (2013.01); *H01L 27/1203* (2013.01); *H01L 29/0649* (2013.01); *H01L 29/41783* (2013.01); *H01L 29/42356* (2013.01); *H01L 29/45* (2013.01); *H01L 29/66742* (2013.01); *H01L 29/78603* (2013.01)

(58) Field of Classification Search
CPC ............... H01L 27/01; H01L 31/0392; H01L 29/66545; H01L 29/76648; H01L 29/7835; H01L 27/1207
See application file for complete search history.

(56) References Cited

U.S. PATENT DOCUMENTS

| | | | |
|---|---|---|---|
| 2004/0129977 A1* | 7/2004 | Ohkubo | H01L 21/743 257/347 |
| 2011/0186929 A1* | 8/2011 | Heinrich | H01L 27/0207 257/350 |
| 2011/0278581 A1* | 11/2011 | Inoue | H01L 21/743 257/66 |
| 2013/0093020 A1* | 4/2013 | Zhu | H01L 21/84 257/347 |
| 2015/0061020 A1* | 3/2015 | Yokoyama | H01L 27/0694 257/347 |
| 2015/0349120 A1* | 12/2015 | Mikalo | H01L 29/7835 257/350 |

OTHER PUBLICATIONS

Grenouillet et al., "UTBB FDSOI transistors with dual STI for a multi-Vt strategy at 20nm node and below," IEDM12-64-67, IEEE 2012.

* cited by examiner

*Primary Examiner* — Phuc Dang
(74) *Attorney, Agent, or Firm* — Amerson Law Firm, PLLC

(57) ABSTRACT

The present disclosure provides a semiconductor device including an SOI substrate comprising an active semiconductor layer disposed on a buried insulating material layer, which is in turn formed on a base semiconductor material. The semiconductor device further includes a gate structure formed on the active semiconductor layer, source/drain regions provided at opposing sides of the gate structure, and a contact structure having contact elements for contacting the source/drain regions. Herein, the contact elements are disposed at opposing sides of the gate structure and are in alignment therewith. Furthermore, one of the contact elements extends through the buried insulating material layer and is in electrical contact with the base semiconductor material.

9 Claims, 12 Drawing Sheets

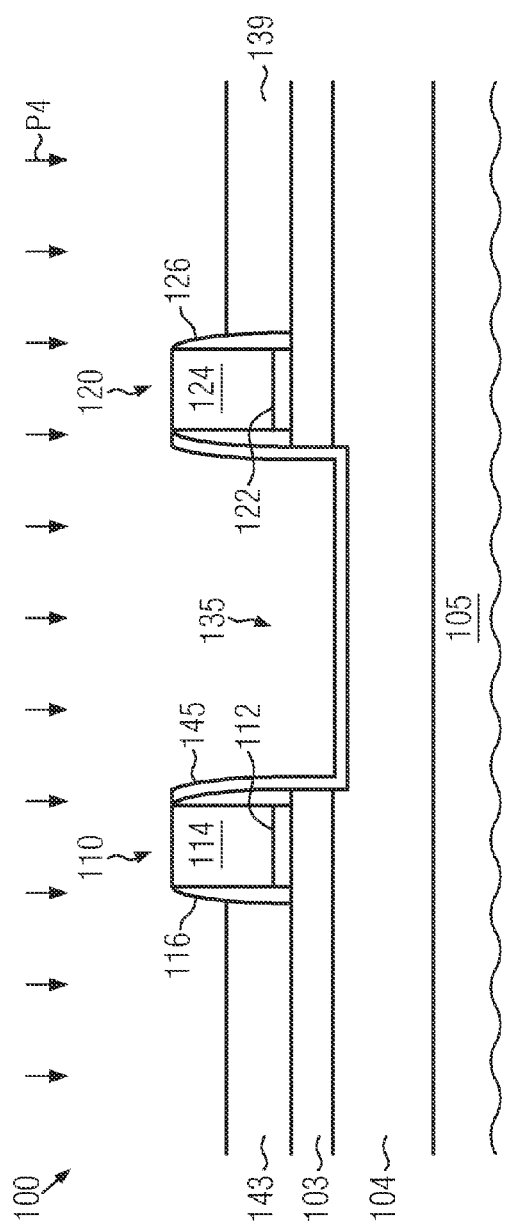
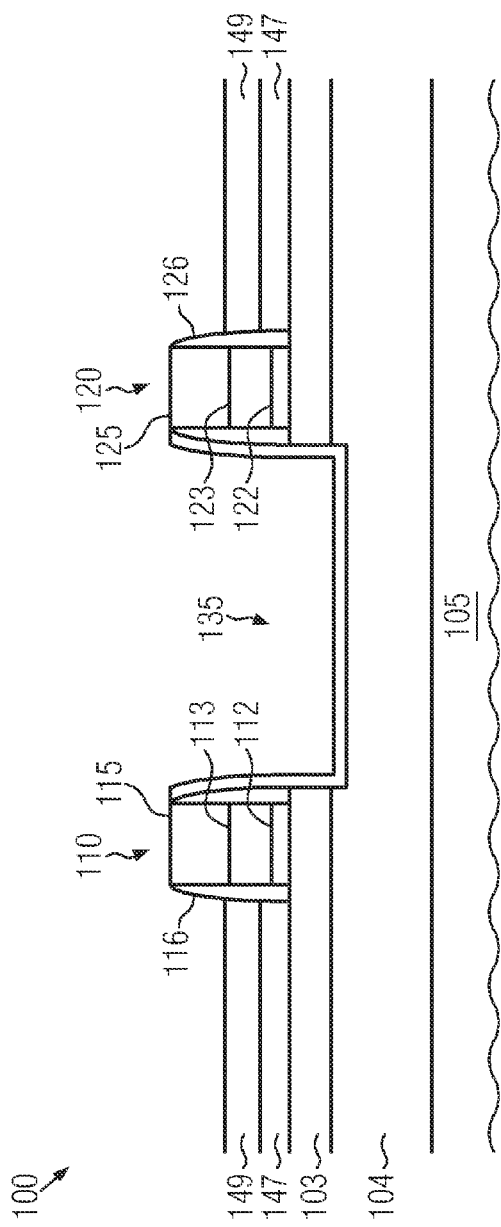

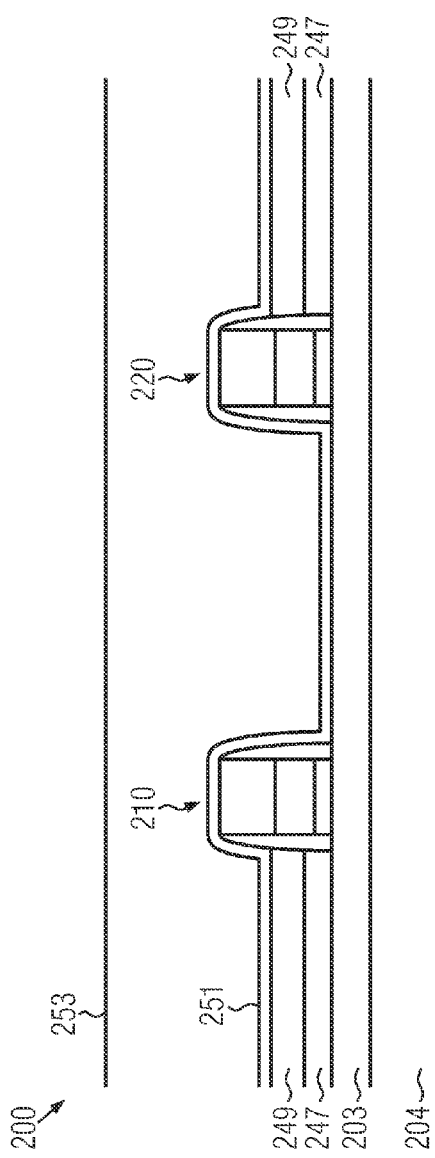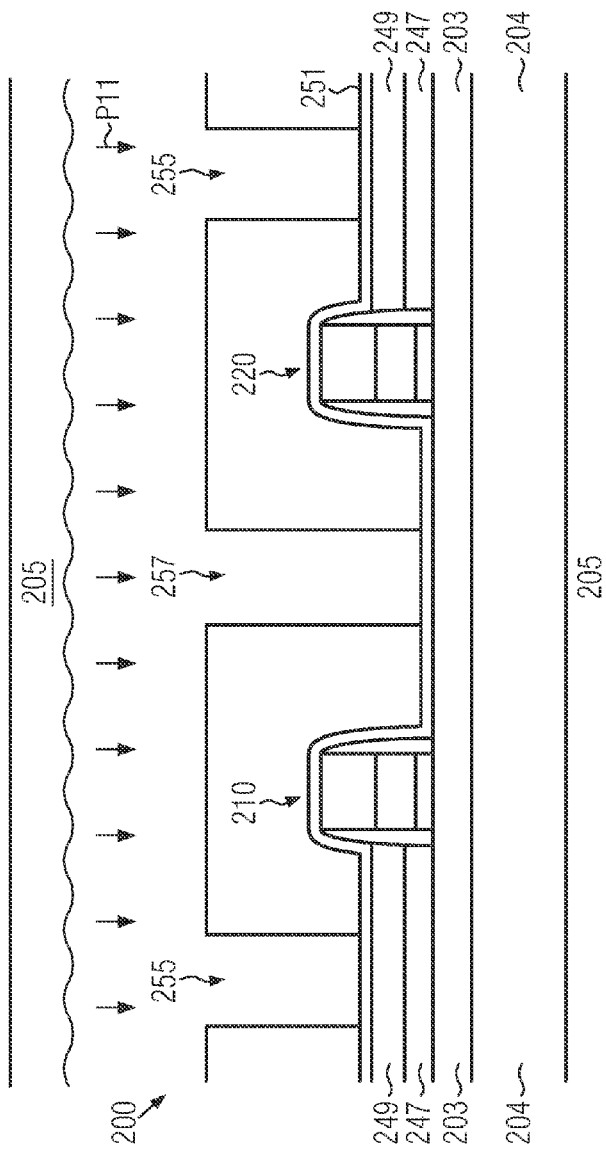
FIG. 3f
FIG. 3g

COMPACT FDSOI DEVICE WITH BULEX CONTACT EXTENDING THROUGH BURIED INSULATING LAYER ADJACENT GATE STRUCTURE FOR BACK-BIAS

BACKGROUND OF THE INVENTION

1. Field of the Invention

The present disclosure generally relates to compact FDSOI devices with Bulex areas for back-bias at advanced technology nodes.

2. Description of the Related Art

For next generation technologies, SOI (semiconductor-on-isolator) technology is an attractive candidate to push forward the frontiers imposed by Moore's law. Particularly, fully depleted SOI (FDSOI) techniques seem to provide promising technologies that allow the fabrication of semiconductor devices at technology nodes of 28 nm and beyond. Aside from FDSOI techniques allowing the combination of high performance and low power consumption, complemented by an excellent responsiveness to power management design techniques, the fabrication processes, as employed in FDSOI techniques, are comparatively simple and actually represent a low risk evolution of conventional planar bulk CMOS techniques.

In general, a MOSFET as fabricated by SOI techniques is a semiconductor device (MOSFET) in which a semiconductor layer, such as silicon, germanium or silicon germanium, is formed on an insulator layer, e.g., a buried oxide (BOX) layer, which is in turn formed on a semiconductor substrate. Conventionally, there are two types of SOI devices: PDSOI (partially depleted SOI) and FDSOI MOSFETs. For example, in an N-type PDSOI MOSFET, a P-type film being sandwiched between a gate oxide (GOX) and a buried oxide (BOX) is so large that the depletion region cannot cover the whole P-region. Therefore, to some extent, PDSOI devices behave like bulk MOSFETs.

In contrast, the depletion region covers the whole semiconductor layer in an FDSOI device. As the GOX in FDSOI techniques supports fewer depletion charges than the bulk, an increase in inversion charges occurs in the fully depleted semiconductor layer, resulting in higher switching speeds.

In recent attempts to provide a simple way of meeting power/performance targets, back-biasing was suggested for FDSOI devices. Herein, back-biasing consists of applying a voltage just under the BOX of target semiconductor devices. In doing so, the electrostatic control of the semiconductor device is changed and the threshold voltage is shifted to either obtain more drive current (hence, higher performance) at the expense of increased leakage current (forward back bias, FBB) or to cut leakage current at the expense of reduced performance. While back bias in planar FDSOI techniques is somewhat similar to body bias as implemented in bulk CMOS technologies, it offers a number of key advantages in terms of level and efficiency of the bias that may be applied. For example, back-biasing can be utilized in a dynamic way on a block-by-block basis. It can be used to boost performance during the limited periods of time when maximum peak performance is required from that block. It can also be used to cut leakage during the periods of time when limited performance is not an issue.

The publication "UTBB FDSOI Transistors with Dual STI for a MultiV$_t$ Strategy at 20 nm Node and Below" by Grenouillet et al. (published in Electron Devices Meeting (IEDM), 2012 IEEE International, IEEE, December 2012, pages 3.6.1-3.6.4) shows a back gate architecture in FDSOI technology with standard SOI wafers, where back bias contacts are implemented via silicide contacts formed in bulk exposed areas located adjacent to SRAM and logic MOSFET devices.

In the following, a known semiconductor device structure will be described with regard to FIG. 1. The illustrated semiconductor device structure has two MOSFET devices 1 and 2 which are provided in accordance with FDSOI techniques. Each of the MOSFET devices 1 and 2 is formed by a gate electrode disposed on an active semiconductor layer 3 of an SOI substrate as described above, particularly over a BOX layer 4 and a base substrate 5. Well portions 6 and 7 are formed within the base substrate 5.

The MOSFET devices 1 and 2 are separated by an isolation element 8, such as a shallow trench isolation (STI) element, which is formed between the MOSFET devices 1 and 2. Furthermore, the MOSFET devices 1 and 2 are laterally enclosed by a deep STI structure 9.

In order to provide a back-bias contact, a bulk-exposed region 10 (also referred to as bulex) is provided for contacting the doped well region 6 in the base substrate 5. Contacts and silicide regions are not shown in FIG. 1. The bulex area 10 is conventionally formed by locally removing the active semiconductor layer 3 and the BOX layer 4 so as to expose an upper surface of the base substrate 5. In accordance with current bulex/hybrid area modules as employed in the fabrication process of FDSOI device structures, bulex areas having a lateral extension of 150 nm in the cross section illustrated in FIG. 1 are formed.

In view of the above-described prior art, it is, therefore, desirable to provide compact SOI, e.g., FDSOI, devices at advanced technology nodes, e.g., 28 nm and beyond, with back bias contact structures, where the integration density may be further increased despite having to provide for or allow for the area necessary for the formation of the back bias contact.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides in a first aspect a semiconductor device. In accordance with some illustrative embodiments of the present disclosure, the semiconductor device includes an SOI substrate comprising an active semiconductor layer disposed on a buried insulating material layer, which is, in turn, formed on a base semiconductor material. The semiconductor device further includes a gate structure formed on the active semiconductor layer, source/drain regions provided at opposing sides of the gate structure and a contact structure having contact elements for contacting the source/drain regions. Herein, the contact elements are disposed at opposing sides of the gate structure and are in alignment therewith. Furthermore, one of the contact elements extends through the buried insulating material layer and is in electrical contact with the base semiconductor material.

In accordance with other illustrative embodiments disclosed herein, the semiconductor device includes an SOI substrate comprising an active semiconductor layer disposed on a buried insulating material layer, which is, in turn, formed on a base semiconductor material. The semiconductor device further includes a gate structure formed on the active semiconductor layer, one of a source/drain region provided at the first side of the gate structure, and a contact structure having a first contact element for electrically contacting the one of a source/drain region at the first side and a second contact element provided at the second side of the gate structure, the second side being opposite to the first side. Herein, the active semiconductor layer is removed at the second side in alignment with the gate structure, wherein the second contact element extends through the buried insulating material layer for electrically contacting the base semiconductor material at the second side.

In accordance with yet additional illustrative embodiments disclosed herein, the semiconductor device structure includes an SOI substrate with an active semiconductor layer disposed on a buried insulating material layer, which is, in turn, formed on a base semiconductor material. The semiconductor device structure further includes a first transistor device with a first gate structure disposed on the SOI substrate, a second transistor device with a second gate structure disposed on the SOI substrate adjacent to the first gate structure, and a contact structure having contact elements for contacting source/drain regions provided at opposing sides of each of the first and second gate structures, wherein the first and second transistor devices share a common drain region. A contact element of the contact structure contacting the common drain region further extends through the buried insulating material layer and electrically contacts the base semiconductor material.

In accordance with yet other illustrative embodiments disclosed herein, a method is disclosed that includes providing an SOI substrate comprising an active semiconductor layer disposed on a buried insulating material layer, which is, in turn, formed on the base semiconductor material, forming a gate structure on the active semiconductor layer, providing source/drain regions at opposing sides of the gate structure, and forming a contact structure with contact elements for contacting the source/drain regions, wherein the contact elements are formed at opposing sides of the gate structure and in alignment therewith. One of the contact elements further extends through the buried insulating material layer and electrically contacts the base semiconductor material.

In accordance with yet other illustrative embodiments disclosed herein, a method is disclosed that includes providing an SOI substrate comprising an active semiconductor layer disposed on a buried insulating material layer, which is, in turn, formed on a base semiconductor material, forming a gate structure on the active semiconductor layer, covering the active semiconductor layer at a first side of the gate structure by a masking pattern, and removing the active semiconductor layer at the second side in accordance with the masking pattern, forming a contact structure having a first contact element for electrically contacting the active semiconductor layer at the first side and a second contact element located at the second side of the gate structure, which second side is opposite to the first side, wherein the second contact element extends through the buried insulating material layer for electrically contacting the base semiconductor material at the second side.

In accordance with yet other illustrative embodiments disclosed herein, a method is disclosed that method includes providing an SOI substrate comprising an active semiconductor layer disposed on the buried insulating material layer, which is, in turn, formed on the base semiconductor material, providing a first transistor device by forming a first gate structure on the SOI substrate and providing source/drain regions at opposing sides of the first gate structure, providing a second transistor device by forming a second gate structure disposed on the SOI substrate adjacent to the first gate structure and providing source/drain regions at opposing sides of the second gate structure, and forming a contact structure having contact elements for contacting the source/drain regions, wherein a contact element of the contact structure extends through the buried insulating material layer and electrically contacts the base semiconductor material, wherein the first and second transistor devices share a common drain region and the contact element contacting the base semiconductor material also contacts the common drain region.

BRIEF DESCRIPTION OF THE DRAWINGS

The disclosure may be understood by reference to the following description taken in conjunction with the accompanying drawings, in which like reference numerals identify like elements, and in which:

FIGS. 2a-2l schematically illustrate, in cross-sectional views, a process of fabricating a semiconductor device structure in accordance with some illustrative embodiments of the present disclosure; and FIGS. 3a-3j schematically illustrate, in cross-sectional views, a process of fabricating a semiconductor device structure in accordance with other illustrative embodiments of the present disclosure.

Figure 1:
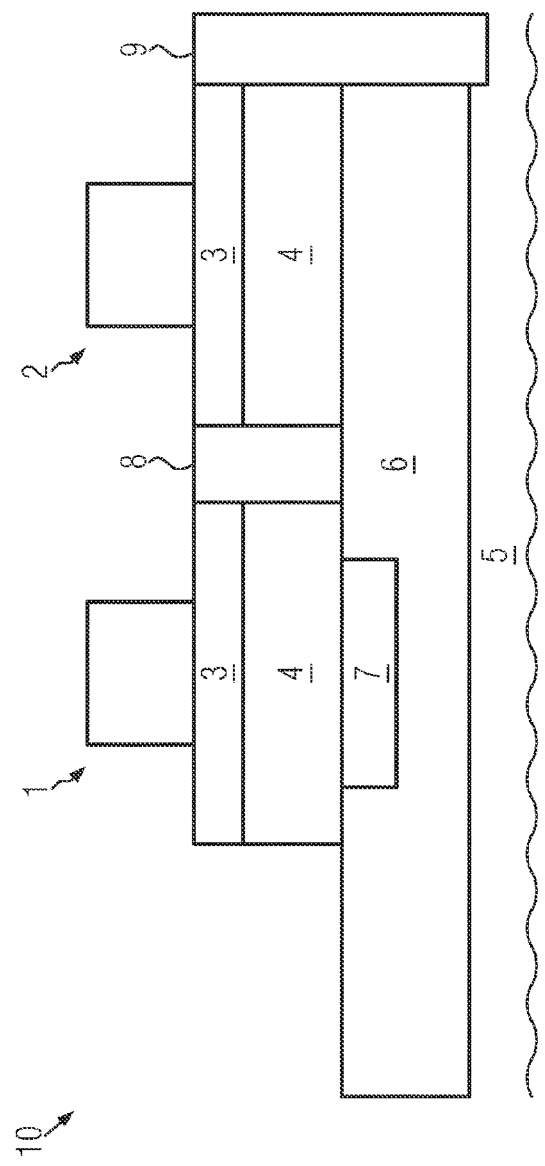
FIG. 1 schematically illustrates, in a cross-sectional view, a semiconductor device structure as known in the art.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to a method of forming a semiconductor device and to semiconductor devices, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which may be fabricated by using advanced technologies, i.e., the semiconductor devices may be fabricated by technologies applied to approach technology nodes smaller than 100 nm, for example, smaller than 50 nm or smaller than 35 nm, e.g., at 28 nm or below. After a complete review of the present application, the person skilled in the art will appreciate that, according to the present disclosure, ground rules smaller or equal to 45 nm, e.g., at 28 nm or below, may be imposed but that the present invention is not limited to such examples. After a complete review of the present application, the person skilled in the art will also appreciate that the present disclosure may be employed in fabricating semiconductor devices with structures of minimal length dimensions and/or width dimensions smaller than 100 nm, for example, smaller than 50 nm or smaller than 35 nm or smaller than 28 nm. For example, the present disclosure may provide semiconductor devices fabricated by using 45 nm technologies or below, e.g., 28 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device under design.

In general, SOI devices have an active semiconductor layer disposed on a buried insulating material layer, which, in turn, is formed on a base substrate material. In accordance with some illustrative embodiments herein, the active semiconductor layer may comprise one of silicon, germanium, silicon germanium and the like. The buried insulating material layer may comprise an insulating material, e.g., silicon oxide or silicon nitride. The base substrate material may be a base material that may be used as a substrate as known in the art, e.g., silicon and the like. After a complete review of the present application, the person skilled in the art will appreciate that, in accordance with illustrative embodiments employing FDSOI substrates, the active semiconductor layer may have a thickness of about 20 nm or less, while the buried insulating material layer may have a thickness of about 145 nm or, in accordance with advanced techniques, the buried insulating material layer may have a thickness in a range from about 10-30 nm. For example, in some special illustrative embodiments of the present disclosure, the active semiconductor layer may have a thickness of about 6-10 nm.

As to a crystallographic plane orientation of the base substrate material, similar to that of an ordinary silicon device, an SOI substrate whose surface is a face (100) may be used. However, in order to improve the performance of a PMOS semiconductor device, a surface of the PMOS semiconductor device may be used as a face (110). Alternatively, a hybrid plane orientation substrate whose surface may be mixed by a face (100) and a face (110) may be used. With regard to a varactor device, there is no restriction on a crystal plane orientation such that an impurity concentration, film thickness, dimension ratio of the device and the like can be appropriately adjusted to obtain a capacitance characteristic that is suitable according to the plane orientation set by other requirements. In alternative embodiments, the base substrate material may be of an N-type when N-accumulation and/or N-inversion devices are considered (otherwise P-type for P-accumulation and/or P-inversion).

Figure 2A:
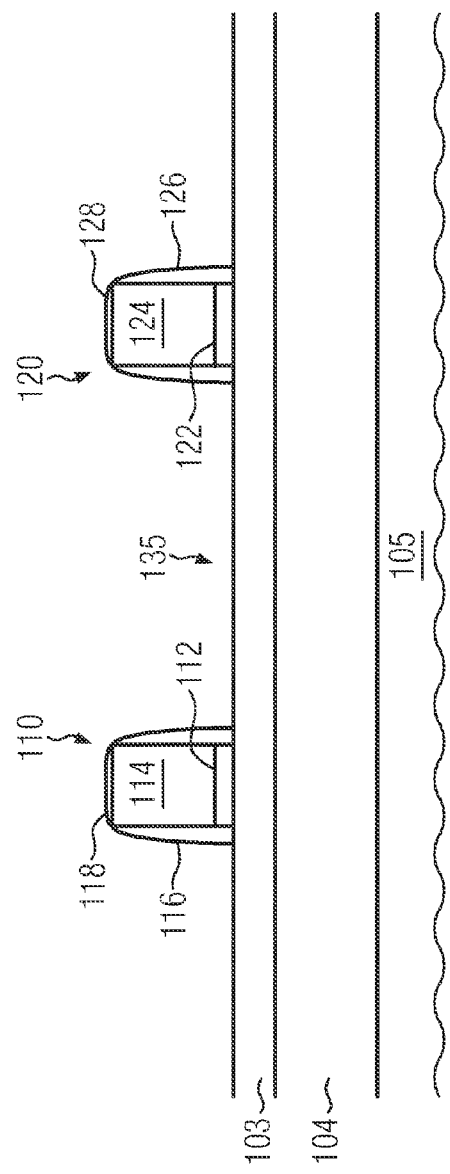

FIG. 2a schematically illustrates a semiconductor device structure 100 comprised of a plurality of laterally spaced-apart gate structures 110 and 120 at an early stage during fabrication, particularly after the gate structures 110, 120 were formed on an SOI substrate. Herein, the SOI substrate is formed, as described above, by an active semiconductor layer 103 that is formed on a buried insulating material layer 104, which is, in turn, disposed on a base semiconductor material 105. For example, the active semiconductor layer 103 may be provided by a semiconductor material, e.g., silicon or silicon germanium. In accordance with some examples, the active semiconductor layer 103 may have a thickness in a range from about 5-10 nm. In accordance with some illustrative embodiments of the present disclosure, the buried insulating material 104 may be a silicon oxide material and may have a thickness in a range from about 10-30 nm, alternatively, the thickness may be in a range from 130-160 nm, e.g., about 149 nm. In accordance with some illustrative embodiments, the base substrate material 105 may be formed by silicon or any other appropriate semiconductor material.

As illustrated in FIG. 2a, the gate structures 110 and 120 may be formed in and above an active region of the SOI substrate (see 103, 104, 105 in the FIGS. 2a-2l). Alternatively, the gate structures 110 and 120 may be separated by at least one shallow trench isolation structure or element (not illustrated).

In accordance with some illustrative embodiments of the present disclosure, the gate structure 110 may comprise a gate dielectric structure 112, such as one or more gate oxide layers (e.g., silicon oxide and/or a high-k material such as hafnium oxide and so on), one or more optional work function adjusting materials (not illustrated), e.g., TiN, and a gate electrode material 114, e.g., one of an appropriate gate metal and an amorphous silicon material and a polysilicon material. Of course, a person skilled in the art will appreciate that the gate structure 110 may be encapsulated by an insulating material, e.g., by forming a sidewall spacer structure 116 comprising one or more layers of at least one of silicon oxide and silicon nitride, and a gate cap 118 covering an upper surface of the gate electrode material 114.

In accordance with some illustrative embodiments of the present disclosure, the gate structure 120 may comprise a gate dielectric structure 122, such as one or more gate oxide layers (e.g., silicon oxide and/or a high-k material such as hafnium oxide and so on), one or more optional work function adjusting materials (not illustrated), e.g., TiN, and a gate electrode material 124, e.g., one of an appropriate gate metal and an amorphous silicon material and a polysilicon material. The gate structure 120 may be encapsulated by an insulating material, e.g., by forming a sidewall spacer structure 126 comprising one or more layers of at least one of silicon oxide and silicon nitride, and a gate cap 128 covering an upper surface of the gate electrode material 124.

After a complete review of the present application, a person skilled in the art will appreciate that at least one of the gate structures 110, 120 may be provided in accordance with gate-first or gate-last techniques. Therefore, in accordance with some illustrative embodiments employing gate-last techniques, the respective one of the gate structures 110, 120 being formed by gate-last techniques may represent a dummy gate structure as is well known in replacement gate techniques.

Figure 2B:
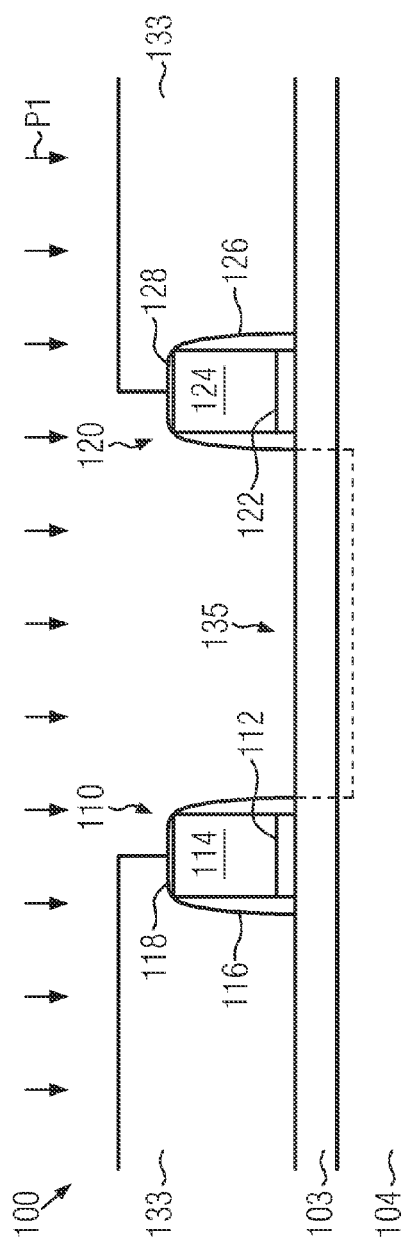

Referring to FIG. 2b, the semiconductor device structure 100 is schematically illustrated at a more advanced stage during fabrication, particularly, after a masking pattern 133 is formed, the masking pattern 133 covering one side of each of the gate structures 110, 120. Alternatively, the masking pattern 133 may only leave one side of one of the gate structures 110, 120 exposed to further processing. In accordance with some illustrative embodiments of the present disclosure, the masking pattern 133 may be provided on the basis of lithographic techniques to select an area of the active semiconductor material 103 intended as a landing area for a source/drain contact of the gate structure 110, 120.

After having formed the masking pattern 133, a process P1 may be performed for removing the active semiconductor material layer 103 from above the buried insulating material layer 104 in the exposed area. In accordance with some illustrative embodiments herein, a wet etch process or plasma etching process may be employed for removing the material of the active semiconductor material layer 103 in the exposed region as it is indicated in FIG. 2b by a broken line.

Figure 2C:
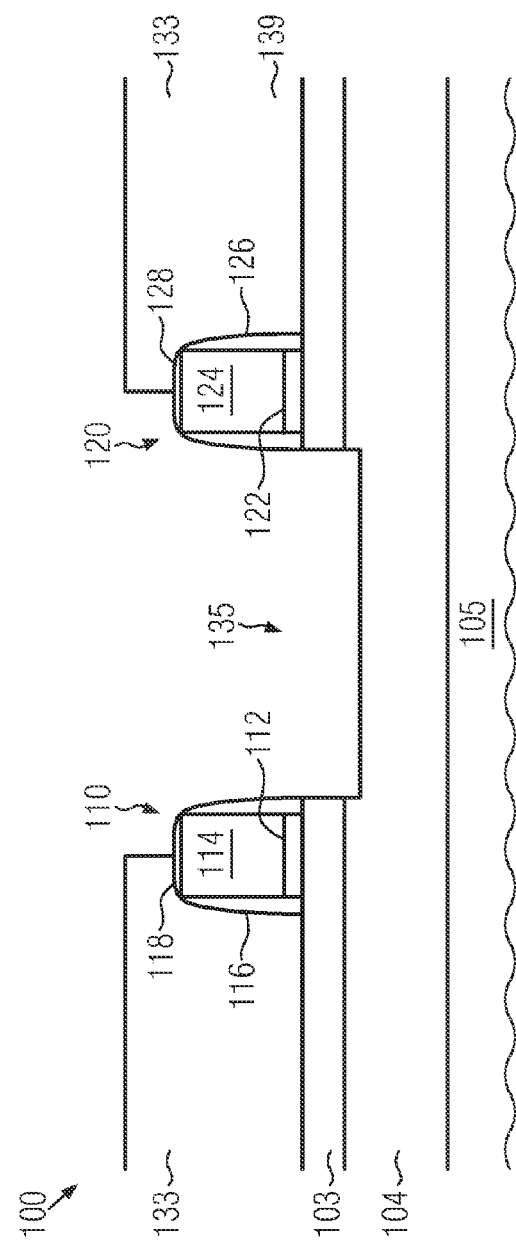

Referring to FIG. 2c, the semiconductor device structure 100 is schematically illustrated at a more advanced stage during fabrication, particularly after the process P1 is completed. As illustrated in FIG. 2c, due to the process P1, a recess 135 is formed in accordance with the masking pattern 133 at one side of at least one of the gate structures 110, 120. After a complete review of the present application, a person skilled in the art will appreciate that, although an overetch of the active semiconductor material layer 103 is illustrated in FIG. 2c, the process P1 may be self-limiting when exposing an upper surface of the buried insulating material layer 104 to keep the etching of the buried insulating material layer 104 as small as possible.

Figure 2D:
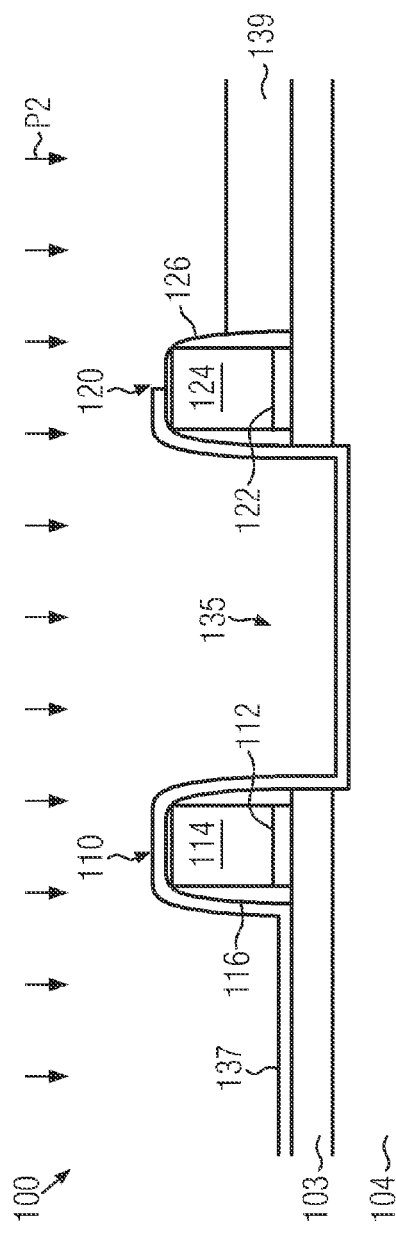

Referring to FIG. 2d, the semiconductor device structure 100 is schematically illustrated at a more advanced stage during fabrication, particularly after the masking pattern 133 is removed (e.g., in a resist strip process, not illustrated, to be performed after the process P1 is completed and the recess 135 is formed) and after a liner 137 is formed on the semiconductor device structure 100.

In accordance with some illustrative embodiments of the present disclosure, the liner 137 may be formed by depositing liner forming material in a blanket deposition process and, subsequently, patterning the deposited liner forming material such that one side of one of the gate structures 110 and 120 (here in FIG. 2d: the gate structure 120) is exposed to further processing. For example, a lithographical process (not illustrated) may be performed to pattern the liner forming material so as to select a PMOS device such that the active semiconductor material 103 present at one side of the PMOS device (here, for example, the gate structure 120) is exposed to further processing.

Subsequently, a process P2 may be performed for epitaxially growing semiconductor material, e.g., silicon, silicon germanium, silicon carbon and the like, in alignment with the liner 137. Accordingly, a raised source/drain region 139 may be formed at one side of the gate structure 120 opposite to that side of the gate structure 120 at which the recess 135 was formed.

Figure 2E:
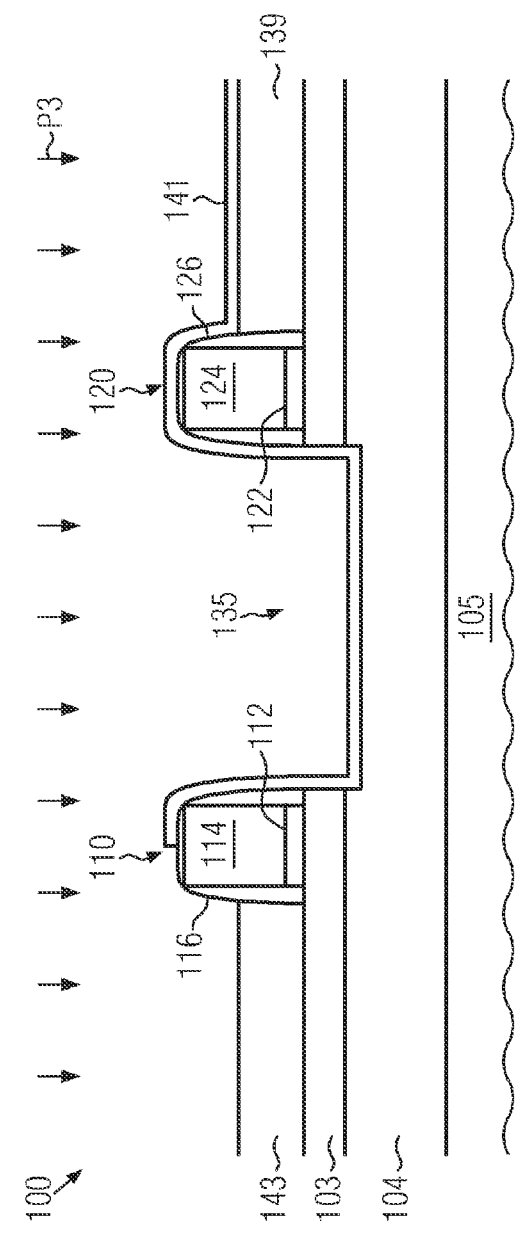

Referring to FIG. 2e, the semiconductor device structure 100 is schematically illustrated at a more advanced stage during fabrication, particularly after the raised source/drain region 139 is formed and a patterned liner 141 covering the gate structure 120, the raised source/drain region 139, and the recess 135 is formed, while the active semiconductor material 103 at one side of the gate structure 110 opposing the recess 135 is left uncovered. In accordance with some illustrative embodiments of the present disclosure, the raised source/drain region 139 may represent one of a raised source region and a raised drain region associated with the gate structure 120 such that a one-sided raised source/drain configuration may be implemented with regard to the gate structure 120.

Subsequently, a process P3 may be performed for epitaxially growing a semiconductor material, such as silicon, silicon germanium, silicon carbon and the like, to form a raised source/drain region 143 at one side of the gate structure 110. In accordance with some illustrative embodiments of the present disclosure, the raised source/drain region 143 may represent one of a raised source region and a raised drain region associated with the gate structure 110 such that a one-sided raised source/drain configuration may be implemented with regard to the gate structure 110.

In accordance with some illustrative embodiments of the present disclosure, at least one of the liner layers 137 and 141 may be formed with a thickness of about 10 nm or less, such as about 5 nm or less. In accordance with some illustrative embodiments herein, at least one of the liner layers 137 and 141 may be formed by depositing silicon nitride material over the semiconductor device structure. After a complete review of the present application, a person skilled in the art will appreciate that, in accordance with some special illustrative examples, the material of the liner layer 137 and the liner layer 141 may differ from the material of the sidewall spacer 116 and 126 and/or the gate cap 118 and 128. In this way, the liner layer 137 may be selectively removed relative to the gate structures 110 and 120 without affecting the gate structures 110 and 120. Accordingly, the gate electrode materials 114 and 124 and/or the gate dielectric structures 112 and 122 may remain reliably encapsulated by the sidewall spacers 116 and 126 and the gate caps 118 and 128.

Referring to FIG. 2f, the semiconductor device structure 100 is schematically illustrated at a more advanced stage during fabrication, particularly after a block liner 145 is formed. The block liner 145 may be formed by appropriately patterning the liner layer 141. Alternatively, the liner layer 141 may be removed and the block liner 145 may be subsequently formed by depositing a block liner material and appropriately patterning the deposited block liner material. In accordance with some illustrative embodiments of the present disclosure, the patterned block liner 145 may comprise silicon nitride material. After having provided the block liner 145, the gate caps 118 and 128 are removed from above the gate electrode materials 114 and 124 of the gate structures 110 and 120.

Next, a process P4 may be performed for forming silicide contact regions. Herein, a metal material, such as nickel and the like, may be deposited on the semiconductor device structure 100, followed by a thermal annealing process as known in the art so as to form a silicide material from the metal material deposited on exposed surfaces of the raised source/drain regions 143 and 139, and the gate electrode material 114 and 124. After the thermal annealing process, the process P4 may be continued by removing the unreacted metal material from above the semiconductor device structure in an appropriate etching process. After a complete review of the present application, a person skilled in the art will appreciate that, in accordance with some special illustrative embodiments of the present disclosure, the process P4 may comprise a standard nickel silicide integration module.

Referring to FIG. 2g, the semiconductor device structure 100 is schematically illustrated at a more advanced stage during fabrication, particularly after the process P4 is completed. Due to the process P4, silicide contact regions 149 in the raised source/drain regions 143 and 139 (see FIG. 2f) are formed by metal material consuming the semiconductor material of the raised source/drain regions and leaving remaining portions of unreacted semiconductor materials 147 in the raised source/drain regions.

In accordance with some illustrative embodiments, partially silicided gate electrode materials may be formed in the gate structures 110 and 120 during the process P4 such that a silicide gate contact region 113 and 123 (with upper surfaces 115 and 125, respectively) may be formed in each of the gate structures 110 and 120, possibly leaving remaining unreacted gate electrode materials 112 and 122. After a complete review of the present application, a person skilled in the art will appreciate that this does not pose any limitation of the present disclosure and, in accordance with some alternative embodiments of the present disclosure, fully silicided (FUSI) gate structures may be formed. Next, the block liner 145 may be removed in a subsequent block liner removing step (not illustrated).

Figure 2H:
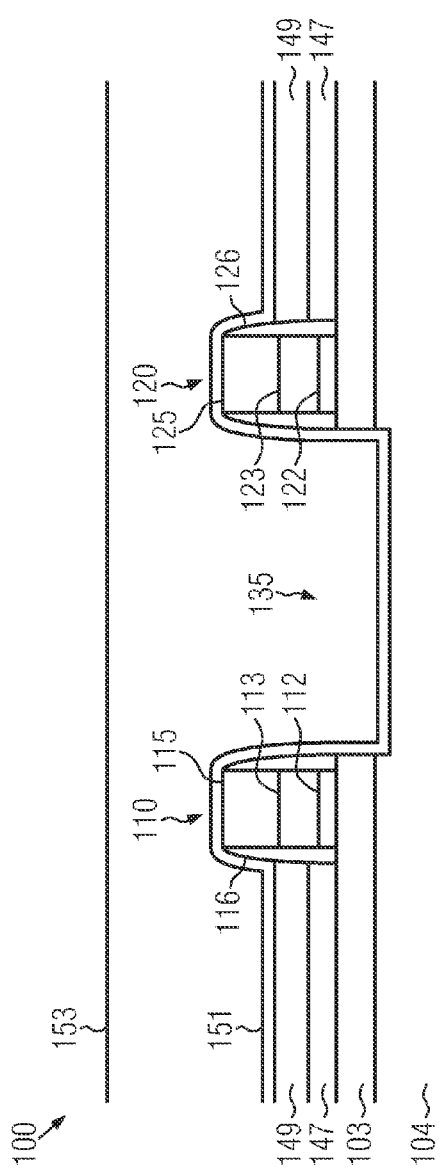

FIG. 2h schematically illustrates the semiconductor device structure 100 at a more advanced stage during fabrication, particularly after the silicide regions 113, 123, 149 are formed and the block liner 145 is removed. At the stage depicted in FIG. 2h, an insulating material layer 151, such as one of a nitride material or an oxide material, is formed on the semiconductor device structure 100 and an interlayer dielectric material 153, such as a spin-on dielectric, e.g., a spin-on glass, a silicon oxide material, e.g., fluorine-doped silicon oxide, porous silicon oxide, and carbon-doped silicon oxide, and the like, is deposited on the insulating material layer 151. After a complete review of the present application, a person skilled in the art will appreciate that the interlayer dielectric (ILD) 153 may be formed in accordance with conventional ILD forming techniques employing spin-on processes and planarization processes, e.g., CMP. After a complete review of the present application, a person skilled in the art will appreciate that the material layers 151 and 153 may be provided in accordance with standard middle end of line (MEOL) techniques.

Figure 2I:
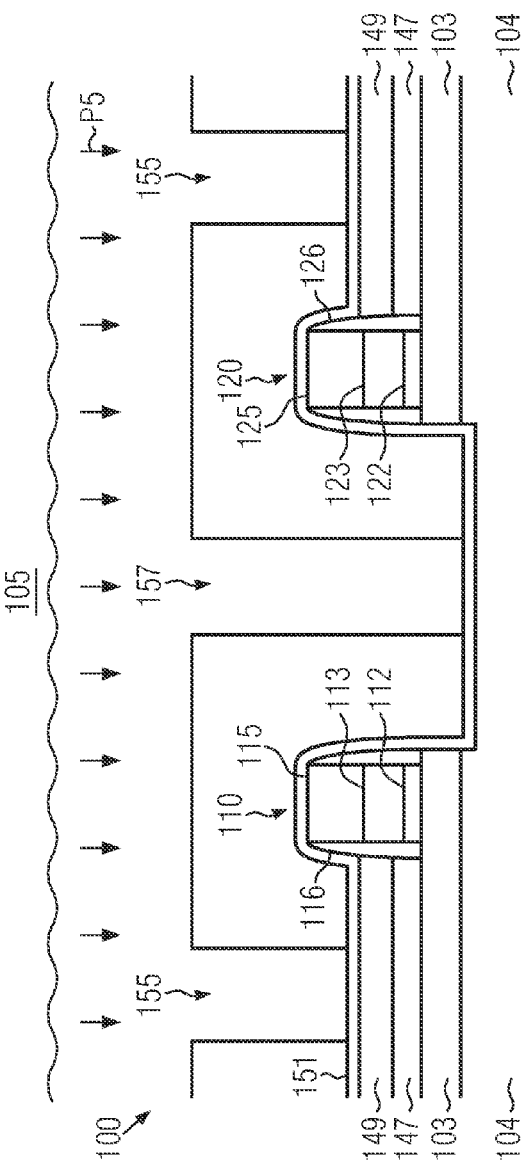

FIG. 2i schematically illustrates the semiconductor device structure 100 at a more advanced stage during fabrication, particularly when a process P5 is performed for forming contact holes 155 and 157 in the ILD 153. The process P5 may be configured so as to selectively remove the ILD 153 relative to the layer 151 such that the process P5 terminates when the layer 151 is exposed. After a complete review of the present application, a person skilled in the art will appreciate that the contact holes 155, 157 may be formed in accordance with an appropriate masking pattern (not illustrated) provided on the ILD 153.

Figure 2J:
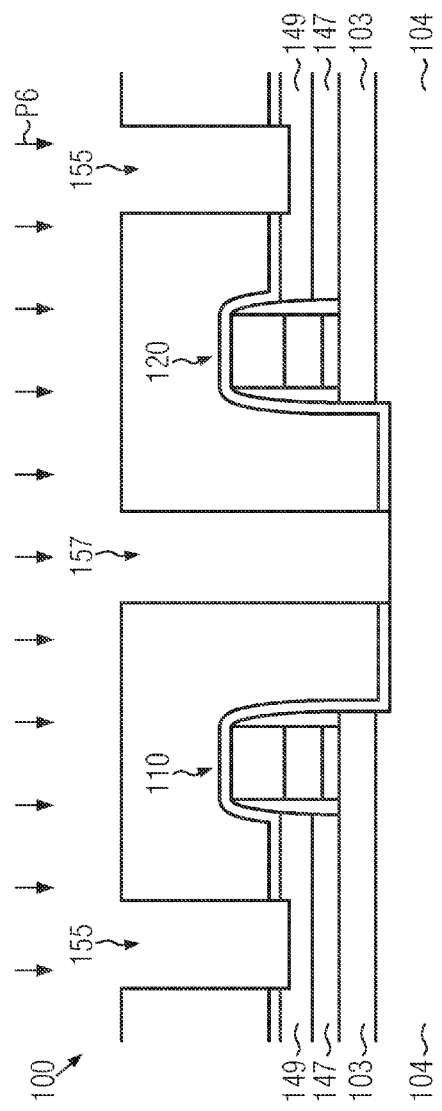

Next, as illustrated in FIG. 2j, a process P6 may be performed for opening the material layer 151 within the contact holes 155 and 157 so as to expose the silicide material 149 in the contact holes 155 and the buried insulating material layer 104 in the contact hole 157. In accordance with some illustrative embodiments of the present disclosure, the process P6 may comprise a selective etching process for selectively etching the material layer 151 relative to the buried insulating material 104 and the silicide material 149.

Figure 2K:
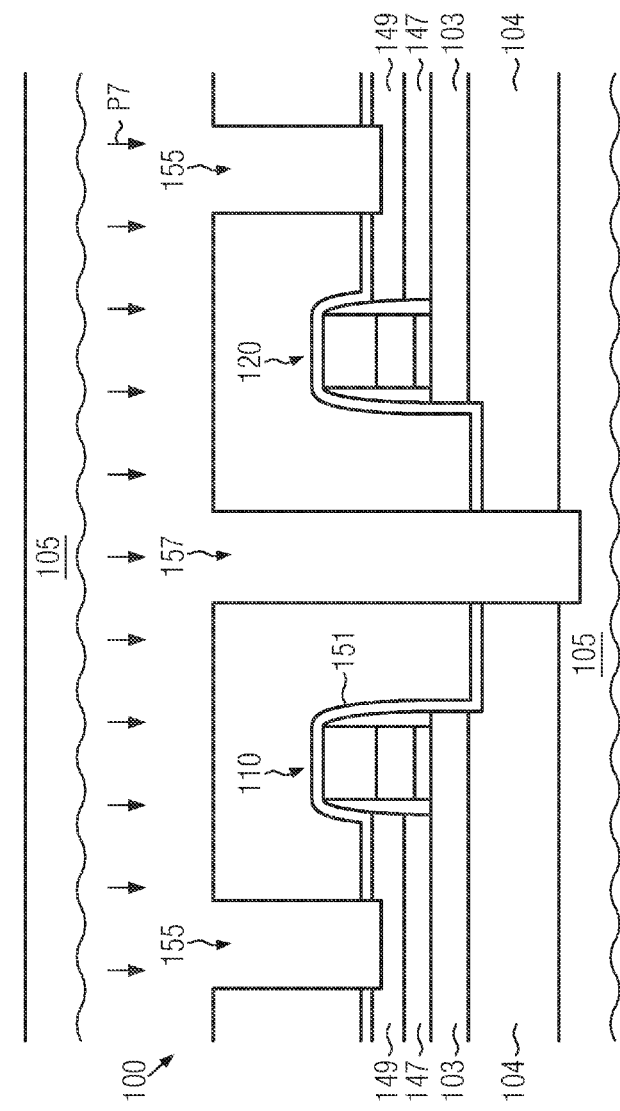

Next, as illustrated in FIG. 2k, a process P7 may be performed for selectively removing the buried insulating material 104 relative to the silicide material 149 such that the base semiconductor material 105 is exposed in the contact hole 157.

Figure 2L:
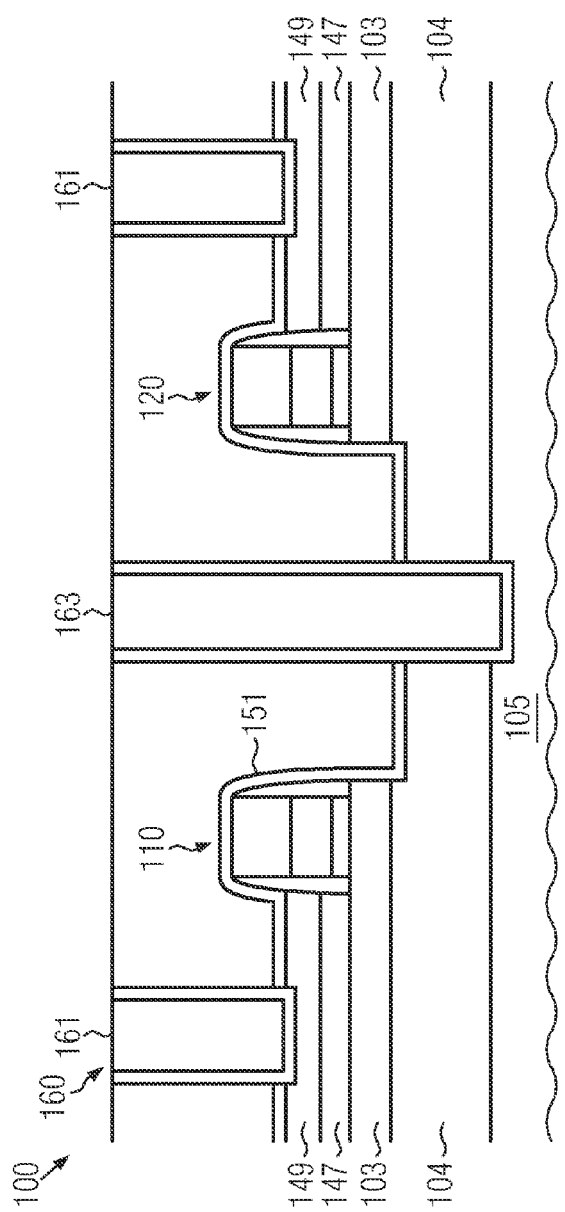

Referring to FIG. 2l, the semiconductor device structure 100 is schematically illustrated at a more advanced stage during fabrication, particularly after a contact structure 160 is formed in the contact holes 155 and 157 (see FIG. 2k). The contact structure 160 may comprise contact elements 161 which are in contact with the silicide regions 149, while a contact element 163 of the contact structure 160 serves for contacting the base substrate material 105. In accordance with some illustrative embodiments of the present disclosure, the contact structure 160 may be formed by depositing a barrier forming material within the contact holes 155, 157 (see FIG. 2k), followed by the position of a contact forming material for filling, if not overfilling, the contact holes. After the contact fill, a planarization process (not illustrated) may be performed in order to obtain the contact elements 161, 163 of the contact structure 160.

In accordance with the fabrication process as described with regard to FIGS. 2a-2l above, a process for locally removing the active semiconductor material layer 103 at one side of at least one of the gate structures 110 and 120 is performed. By locally removing the active semiconductor layer at one side of at least one of the gate structures 110 and 120, an epitaxial growing of semiconductor material for forming raised source/drain regions at both sides of each of the gate structures 110 and 120 is suppressed. Furthermore, the formation of a silicide region within the contact hole 157 for contacting a base substrate material 105 is suppressed such that the contact element 163 is in direct physical contact with the base semiconductor material 105. After a complete review of the present application, a person skilled in the art will appreciate that, although the substrate contact is not provided with a silicide region, a possibly high resistance due to the lack of a silicide contact region to the base semiconductor material 105 is not an issue when a static voltage for imposing a back bias to the gate structures 110, 120 is applied. In accordance with an illustrative embodiment of the present disclosure, the contact element 163 may be coupled to ground potential such that the base semiconductor material 105 is grounded.

With regard to FIGS. 3a-3j, alternative embodiments to the embodiments as described above with regard to FIGS. 2a-2l will be described below.

Figure 3A:
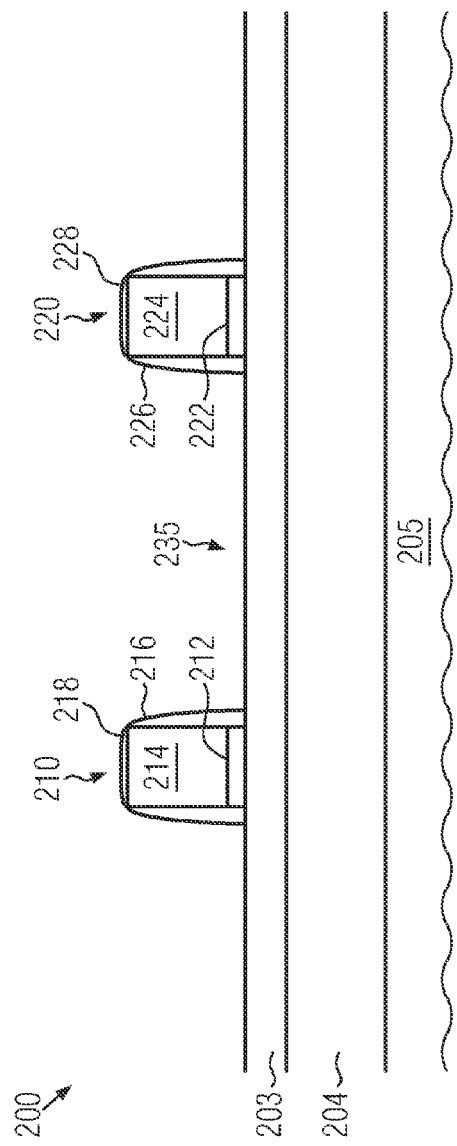

Referring to FIG. 3a, a semiconductor device structure 200 comprised of a plurality of laterally spaced-apart gate structures 210 and 220 is schematically illustrated at an early stage during fabrication, particularly after the gate structures 210, 220 were formed on an SOI substrate. Herein, the SOI substrate is formed, as described above, by an active semiconductor layer 203 that is formed on a buried insulating material layer 204, which is, in turn, disposed on a base semiconductor material 205. For example, the active semiconductor layer 203 may be provided by a semiconductor material, e.g., silicon or silicon germanium. In accordance with some examples, the active semiconductor layer 203 may have a thickness in a range from about 5-10 nm. In accordance with some illustrative embodiments of the present disclosure, the buried insulating material 104 may be a silicon oxide material and may have a thickness in a range from about 10-30 nm, alternatively, the thickness may be in a range from 130-160 nm, e.g., about 149 nm. In accordance with some illustrative embodiments, the base substrate material 205 may be formed by silicon or any other appropriate semiconductor material.

As illustrated in FIG. 3a, the gate structures 210 and 220 may be formed in an active region of the SOI substrate (see 203, 204, 205 in the FIGS. 3a-3j). Alternatively, the gate structures 210 and 220 may be separated by at least one shallow trench isolation structure or element (not illustrated).

In accordance with some illustrative embodiments of the present disclosure, the gate structure 210 may comprise a gate dielectric structure 212, such as one or more gate oxide layers (e.g., silicon oxide and/or a high-k material such as hafnium oxide and so on), one or more optional work function adjusting materials (not illustrated), e.g., TiN, and a gate electrode material 214, e.g., one of an appropriate gate metal and an amorphous silicon material and a polysilicon material. The person skilled in the art will appreciate that the gate structure 210 may be encapsulated by an insulating material, e.g., by forming a sidewall spacer structure 216 comprising one or more layers of at least one of silicon oxide and silicon nitride, and a gate cap 218 covering an upper surface of the gate electrode material 214.

In accordance with some illustrative embodiments of the present disclosure, the gate structure 220 may comprise a gate dielectric structure 222, such as one or more gate oxide layers (e.g., silicon oxide and/or a high-k material such as hafnium oxide and so on), one or more optional work function adjusting materials (not illustrated), e.g., TiN, and a gate electrode material 224, e.g., one of an appropriate gate metal and an amorphous silicon material and a polysilicon material. After a complete review of the present application, a person skilled in the art will appreciate that the gate structure 220 may be encapsulated by an insulating material, e.g., by forming a sidewall spacer structure 226 comprising one or more layers of at least one of silicon oxide and silicon nitride, and a gate cap 228 covering an upper surface of the gate electrode material 224.

After a complete review of the present application, a person skilled in the art will appreciate that at least one of the gate structures 210, 220 may be provided in accordance with gate-first or gate-last techniques. Therefore, in accordance with some illustrative embodiments employing gate-last techniques, the respective one of the gate structures 210, 220 being formed by gate-last techniques may represent a dummy gate structure as is well known in replacement gate techniques.

Figure 3B:
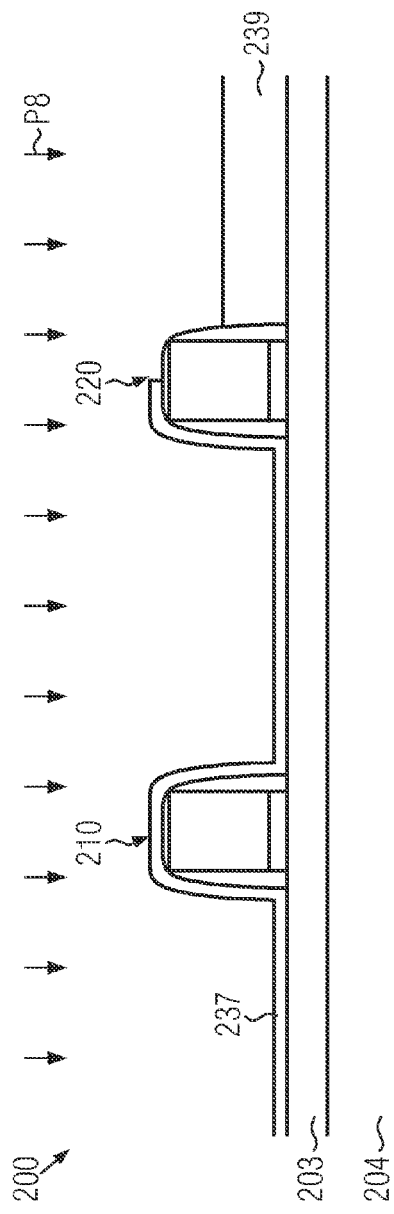

Referring to FIG. 3b, the semiconductor device structure 200 is schematically illustrated at a more advanced stage during fabrication, particularly, after a patterned layer 237 is formed and a process P8 is performed to epitaxially grow a raised source/drain region 239 at one side of the gate structure 220, the side that is not covered by the patterned layer 237 and exposed to further processing. The person skilled in the art will appreciate that the patterned layer 237 may be provided in accordance with techniques as described above with regard to the patterned liner 137. Furthermore, the raised source/drain region 239 may be provided similarly to the raised source/drain region 139 as described above. For the sake of brevity, reference is made to the according description of FIG. 2d above in this regard.

From a complete review of the present application, a person skilled in the art will appreciate that the raised source/drain region 239 may represent one of a raised source region and a raised drain region associated with the gate structure 220 such that a one-sided raised source/drain configuration may be implemented with regard to the gate structure 220. Furthermore, the raised source/drain region 243 may represent one of a raised source region and a raised drain region associated with the gate structure 210 such that a one-sided raised source/drain configuration may be implemented with regard to the gate structure 210

Figure 3C:
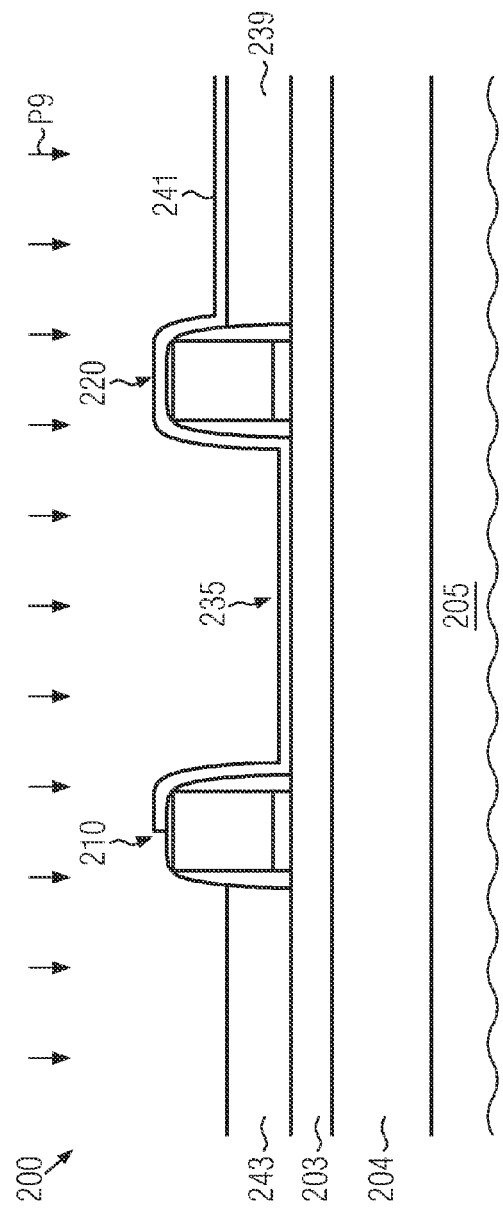

Referring to FIG. 3c, the semiconductor device structure 200 is schematically illustrated at a more advanced stage during fabrication, particularly after the raised source/drain region 239 is formed and a patterned liner 241 covering the gate structure 220 and the raised source/drain region 239 is formed, while the active semiconductor material 203 at one side of the gate structure 210 opposite a common source/drain region 235 of the gate structures 210 and 220 is left uncovered.

Subsequently, a process P9 may be performed for epitaxially growing a semiconductor material, such as silicon, silicon germanium, silicon carbon and the like, to form a raised source/drain region 243 at one side of the gate structure 210.

In accordance with some illustrative embodiments of the present disclosure, at least one of the patterned layers 237 and 241 may be formed with a thickness of about 10 nm or less, such as about 5 nm or less. In accordance with some illustrative embodiments herein, at least one of the patterned layers 237 and 241 may be formed by depositing silicon nitride material over the semiconductor device structure 200. After a complete review of the present application, a person skilled in the art will appreciate that, in accordance with some special illustrative examples, the material of the patterned layers 237 and 241 may differ from the material of the sidewall spacers 216 and 226 and/or the gate caps 218 and 228. In this way, the patterned layer 237 may be selectively removed relative to the gate structures 210 and 220 without affecting the gate structures 210 and 220. Accordingly, the gate electrode materials 214 and 224 and/or the gate dielectric structures 212 and 222 may remain reliably encapsulated by the sidewall spacers 216 and 226 and the gate caps 218 and 228.

Figure 3D:
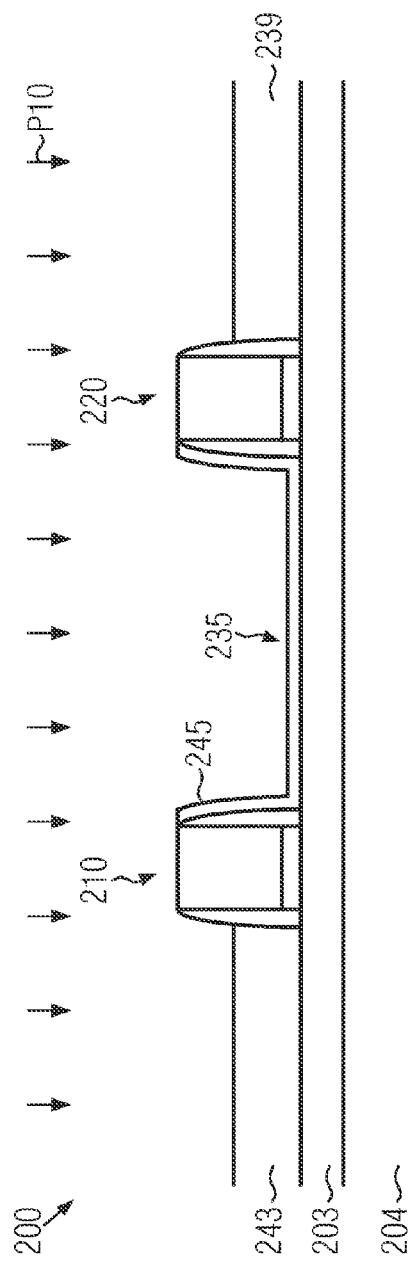

Referring to FIG. 3d, the semiconductor device structure 200 is schematically illustrated at a more advanced stage during fabrication, particularly after a block liner 245 is formed such that the common source/drain region 235 between the gate structures 210 and 220 is covered. The block liner 245 may be formed by appropriately patterning the patterned layer 241. Alternatively, the patterned layer 241 may be removed and the block liner 245 may be subsequently formed by depositing a block liner material and appropriately patterning the deposited block liner material. In accordance with some illustrative embodiments of the present disclosure, the patterned block liner 245 may comprise silicon nitride material. After having provided the block liner 245, the gate caps 218 and 228 may be removed from above the gate electrode materials 214 and 224 of the gate structures 210 and 220.

Next, a process P10 may be performed for forming silicide contact regions. Herein, a metal material, such as nickel and the like, may be deposited on the semiconductor device structure 200, followed by a thermal annealing process as known in the art so as to form a silicide material from the metal material deposited on exposed surfaces of the raised source/drain regions 243 and 239, and the gate electrode material 214 and 224. After the thermal annealing process, the process P10 may be continued by removing the unreacted metal material from above the semiconductor device structure in an appropriate etching process. After a complete review of the present application, a person skilled in the art will appreciate that, in accordance with some special illustrative embodiments of the present disclosure, the process P10 may comprise a standard nickel silicide integration module.

Figure 3E:
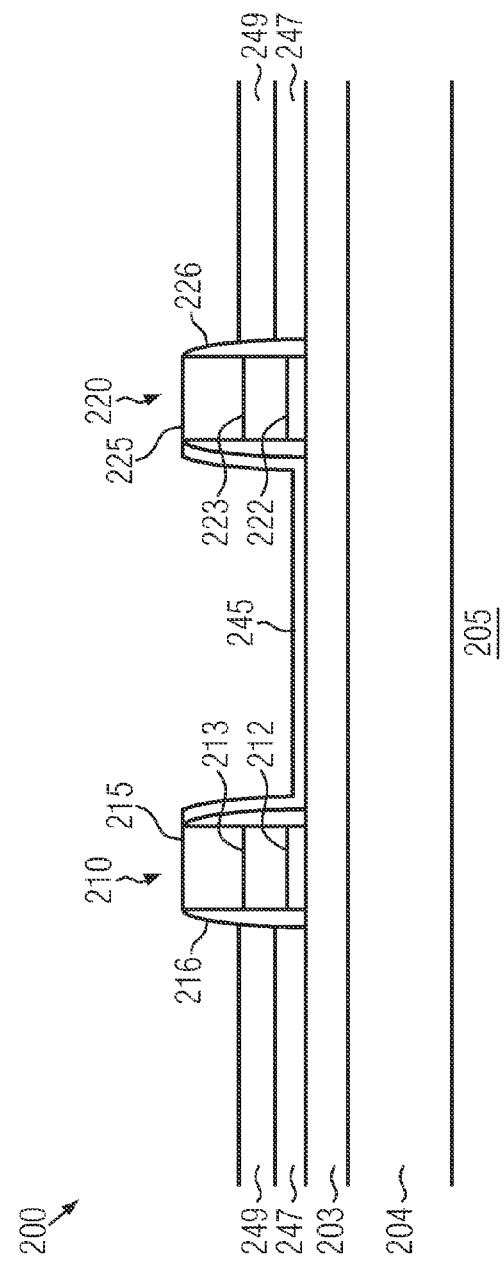

Referring to FIG. 3e, the semiconductor device structure 200 is schematically illustrated at a more advanced stage during fabrication, particularly after the process P10 is completed. Due to the process P10, silicide contact regions 249 in the raised source/drain regions 243, 239 (see FIG. 3d) are formed by metal material consuming the semiconductor material of the raised source/drain regions and leaving remaining portions of unreacted semiconductor materials 247 in the raised source/drain regions.

In accordance with some illustrative embodiments, partially silicided gate electrode materials may be formed in the gate structures 210 and 220 during the process P10 such that a silicide gate contact region 213, 223 (with upper surfaces 215 and 225, respectively) may be formed in each of the gate structures 210 and 220, possibly leaving remaining unreacted gate electrode materials 212 and 222. After a complete review of the present application, a person skilled in the art will appreciate that this does not pose any limitation of the present disclosure and, in accordance with some alternative embodiments of the present disclosure, fully silicided (FUSI) gate structures may be formed. Next, the block liner 245 may be removed in a subsequent block liner removing step (not illustrated).

FIG. 3f schematically illustrates the semiconductor device structure 200 at a more advanced stage during fabrication, particularly after the silicide regions 213, 223, 249 are formed and the block liner 245 is removed. At the stage depicted in FIG. 3f, an insulating material layer 251, such as one of a nitride material or an oxide material, is formed on the semiconductor device structure 200 and an interlayer dielectric material 253, such as a spin-on dielectric, e.g., a spin-on glass, a silicon oxide material, e.g., fluorine-doped silicon oxide, porous silicon oxide, and carbon-doped silicon oxide, and the like, is deposited on the insulating material layer 251. After a complete review of the present application, a person skilled in the art will appreciate that the interlayer dielectric (ILD) 253 may be formed in accordance with conventional ILD forming techniques employing spin-on processes and planarization processes, e.g., CMP. After a complete review of the present application, a person skilled in the art will appreciate that the material layers 251 and 253 may be provided in accordance with standard middle end of line (MEOL) techniques.

FIG. 3g schematically illustrates the semiconductor device structure 200 at a more advanced stage during fabrication, particularly when a process P11 is performed for forming contact holes 255 and 257 in the ILD 253. The process P11 may be configured so as to selectively remove the ILD 253 relative to the layer 251 such that the process P11 terminates when the layer 251 is exposed. After a complete review of the present application, a person skilled in the art will appreciate that the contact holes 255, 257 may be formed in accordance with an appropriate masking pattern (not illustrated) provided on the ILD 253.

Figure 3H:
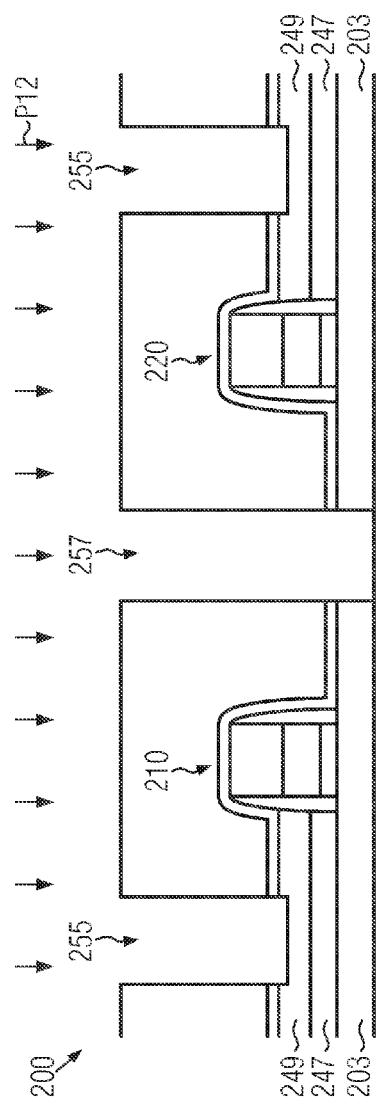

Next, as illustrated in FIG. 3h, a process P12 may be performed for opening the material layer 251 within the contact holes 255 and 257 so as to expose the silicide material 249 in the contact holes 255 and the buried insulating material layer 204 in the contact hole 257. In accordance with some illustrative embodiments of the present disclosure, the process P12 may comprise a selective etching process for selectively etching the material layer 251 relative to the buried insulating material 204 and the silicide material 249.

Figure 3I:
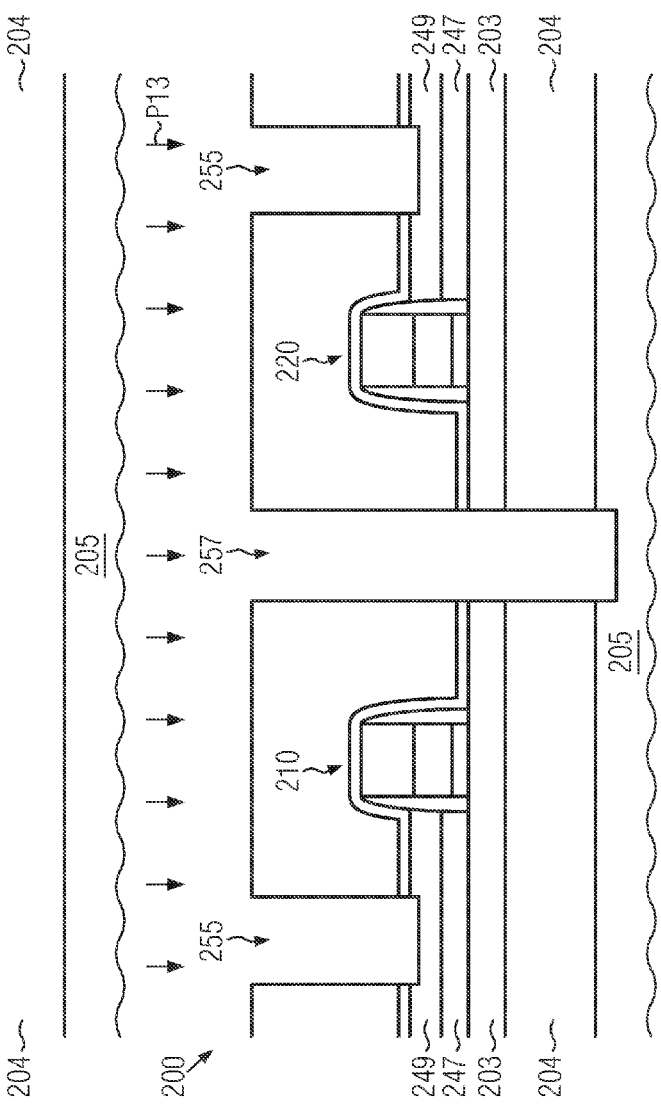

Next, as illustrated in FIG. 3i, a process P13 may be performed for selectively removing the buried insulating material 204 relative to the silicide material 249 such that the base semiconductor material 205 is exposed in the contact hole 257.

Figure 3J:
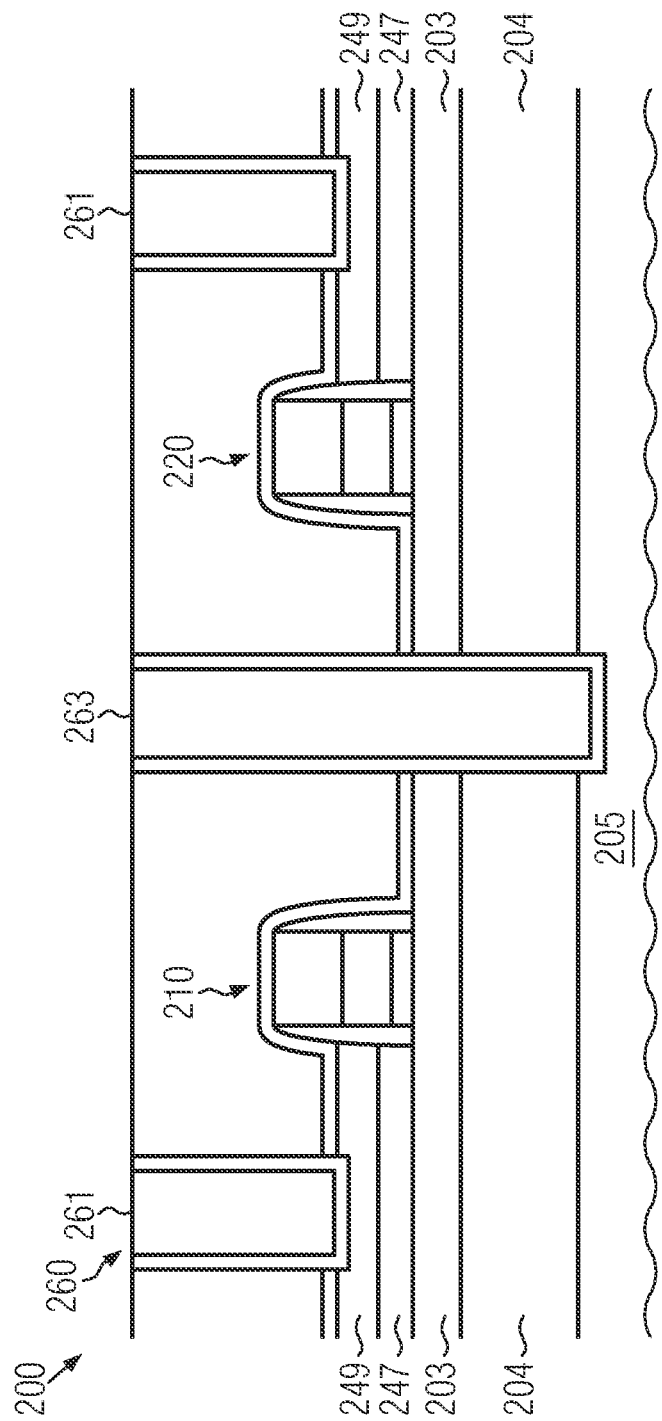

Referring to FIG. 3j, the semiconductor device structure 200 is schematically illustrated at a more advanced stage during fabrication, particularly after a contact structure 260 is formed in the contact holes 255 and 257 (see FIG. 3i). The contact structure 260 may comprise contact elements 261 which are in contact with the silicide regions 249, while a contact element 263 of the contact structure 260 serves for contacting the base substrate material 205.

In accordance with some illustrative embodiments of the present disclosure, the contact structure 260 may be formed by depositing a barrier forming material within the contact holes 255, 257 (see FIG. 3i), followed by the position of a contact forming material for filling, if not overfilling, the contact holes. After the contact fill, a planarization process (not illustrated) may be performed in order to obtain the contact elements 261, 263 of the contact structure 260.

After a complete reading of the present application, a person skilled in the art will appreciate that, as the contact element 263 connects the base substrate material 205 to the common source/drain region 235 (see description to FIG. 3c) between the gate structures 210 and 220, the active semiconductor layer 203 beyond the gate structures 210 and 220 may be isolated from the back bias by appropriately controlling at least one of the gate structures 210 and 220.

In accordance with the fabrication process as described with regard to FIGS. 3a-3j above, a process without locally removing the active semiconductor material layer 203 at one side of at least one of the gate structures 210 and 220 is performed when compared to the process as described above with regard to FIGS. 2a-2l. In the process as described with regard to FIGS. 3a-3j, an epitaxial growing of semiconductor material for forming raised source/drain regions at common sides of the gate structures 210 and 220 is suppressed and gate structures 210 and 220 with one-sided raised source/drain are formed. Furthermore, the formation of a silicide region within the contact hole 257 for contacting a base substrate material 205 is suppressed such that the contact element 263 is in direct physical contact with the base semiconductor material 205. After a complete review of the present application, a person skilled in the art will appreciate that, although the substrate contact is not provided with a silicide region, a possibly high resistance due to the lack of a silicide contact region to the base semiconductor material 205 is not an issue when a static voltage for imposing a back bias to the gate structures 210, 220 is applied. In accordance with an illustrative embodiment of the present disclosure, the contact element 263 may be coupled to ground potential such that the base semiconductor material 205 and the common source/drain region 235 (see description relating to FIG. 3c above) is grounded in parallel.

After a complete review of the present application, a person skilled in the art will appreciate that, in at least some illustrative embodiments of the present disclosure, at least one of the following advantages may be provided. The base semiconductor material of an SOI substrate may be directly contacted in the SOI area. Shorter connection paths may be provided between back-gates. It is possible to separate back gates via a single STI element. The embodiments as described with regard to FIGS. 3a-3j do not add any complexity to known fabrication processes, while embodiments as described above with regard to FIGS. 2a-2l only add one mask layer (mask 133).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. A semiconductor device, comprising:
   an SOI substrate comprising an active semiconductor layer disposed on a buried insulating material layer, which is in turn disposed on a base semiconductor material;
   first and second laterally spaced apart gate structures formed above said active semiconductor layer, each having a gate insulation structure contacting said active semiconductor layer;
   a first source/drain region positioned adjacent a first side of said first gate structure;
   a second source/drain region positioned adjacent a first side of said second gate structure;
   a common source/drain region positioned in said active semiconductor layer between said laterally spaced apart first and second gate structures;
   a first contact element contacting said first source/drain region;
   a second contact element contacting said second source/drain region, and
   a third contact element contacting said common source/drain region, wherein said third contact element further extends through said common source/drain region and said buried insulating material layer and into electrical contact with said base semiconductor material.

2. The semiconductor device of claim 1, further comprising:
   an epi semiconductor material that is part of said first source/drain region and partially defines a first one-sided raised source/drain region configuration associated with said first gate structure, said first one-sided raised source/drain region having a top surface positioned higher than a top surface of said gate insulation structure of said first gate structure;
   an epi semiconductor material that is part of said second source/drain region and partially defines a second one-sided raised source/drain region configuration associated with said second gate structure, said second one sided raised source/drain region having a top surface positioned higher than a top surface of said gate insulation structure of said second gate structure; and
   a metal silicide region formed on each of said first and second one-sided raised source/drain regions.

3. The semiconductor device of claim 1, wherein said third contact element that is in electrical contact with said base semiconductor layer is coupled to ground potential such that said base semiconductor material and said common source/drain region are grounded in parallel.

4. The semiconductor device of claim 3, wherein said common source/drain region is provided as the drain region of said semiconductor device.

5. The semiconductor device of claim 1, wherein said third contact element is in direct physical contact with said base semiconductor substrate.

6. A semiconductor device, comprising:
   an SOI substrate comprising an active semiconductor layer disposed on a buried insulating material layer, which is in turn formed on a base semiconductor material;
   a gate structure formed above said active semiconductor layer and having a gate insulation structure contacting said active semiconductor layer, wherein said active semiconductor layer positioned adjacent a first side of said gate structure is removed;
   a source/drain region positioned adjacent a second side of said gate structure, said second side being positioned on an opposite side of said gate structure than said first side;
   a first contact element contacting said source/drain region, and
   a second contact element located adjacent said first side of said gate structure, wherein said second contact element extends through said buried insulating material layer and into electrical contact with said base semiconductor material.

7. The semiconductor device of claim 6, further comprising an epi semiconductor material that is part of said source/drain region and partially defines a one-sided raised source/drain region configuration associated with said gate structure, said one-sided raised source/drain region having a top surface positioned higher than a top surface of said gate insulation structure.

8. The semiconductor device of claim 6, further comprising:
   an epi semiconductor material that is part of said source/drain region and partially defines a one-sided raised source/drain region configuration associated with said first gate structure, said one-sided raised source/drain region having a top surface positioned higher than a top surface of said gate insulation structure; and
   a metal silicide region formed on said one-sided raised source/drain region.

9. A semiconductor device structure, comprising:
   an SOI substrate comprising an active semiconductor layer disposed on a buried insulating material layer, which is in turn formed on a base semiconductor material;

a first transistor device with a first gate structure disposed on said SOI substrate and having a first gate insulation structure contacting said active semiconductor layer;

a second transistor device with a second gate structure disposed on said SOI substrate and laterally spaced apart from said first gate structure, wherein said second gate structure comprises a second gate insulation structure contacting said active semiconductor layer; and a plurality of contact elements for contacting source/drain regions provided at opposing sides of each of said first and second gate structures;

wherein said first and second transistor devices share a common drain region; and wherein one of said plurality of contact elements contacts said common drain region and further extends through said buried insulating material layer and electrically contacts said base semiconductor material.

* * * * *